US005537368A

United States Patent [19]
O'Brien, Jr. et al.

[11] Patent Number: 5,537,368
[45] Date of Patent: Jul. 16, 1996

[54] ENHANCED ADAPTIVE STATISTICAL FILTER PROVIDING IMPROVED PERFORMANCE FOR TARGET MOTION ANALYSIS NOISE DISCRIMINATION

[75] Inventors: Francis J. O'Brien, Jr., Newport; Marcus L. Graham, North Kingstown; Kai F. Gong, Pawtucket; Sherry E. Hammel, Little Compton, all of R.I.

[73] Assignee: The United States of America as represented by the Secretary of the Navy, Washington, D.C.

[21] Appl. No.: 127,145

[22] Filed: Sep. 22, 1993

[51] Int. Cl.⁶ .................................................. G01S 15/66
[52] U.S. Cl. .......................... 367/135; 367/901; 364/517; 364/724.19
[58] Field of Search ............................. 367/45, 135, 901; 342/195; 364/724.19, 517

[56] References Cited

U.S. PATENT DOCUMENTS

| | | | |
|---|---|---|---|
| 5,027,413 | 6/1991 | Barnard | 382/1 |
| 5,144,595 | 9/1992 | Graham et al. | 367/135 |
| 5,247,470 | 9/1993 | McKown et al. | 364/724.19 |

OTHER PUBLICATIONS

Soni et al., "Adaptive Whitening Filters For Small Target Detection'", Proc. SPIE–Int. Soc. Opt. Eng. (USA), vol. 1698, pp. 21–31, 1992, ISSN 0277786X.

*Primary Examiner*—Ian J. Lobo
*Attorney, Agent, or Firm*—Michael J. McGowan; Prithvi C. Lall; Michael F. Oglo

[57] ABSTRACT

An adaptive statistical filter system for receiving a data stream comprising a series of data values from a sensor associated with successive points in time. Each data value includes a data component representative of the motion of a target and a noise component, with the noise components of data values associated with proximate points in time being correlated. The adaptive statistical filter system includes a prewhitener module, a plurality of statistical filters of different orders and a selection module. The prewhitener module receives the data stream from the sensor and generates a corrected data stream comprising a series of corrected data values each associated with a data value of the data stream, each including a data component and a noise component with the noise components of data values associated with proximate points in time being decorrelated. The plural statistical filters are coupled to receive the corrected data stream in parallel from the prewhitener. Each statistical filter generates coefficient values to fit the corrected data stream to a polynomial of corresponding order and fit values representative of the degree of fit of corrected data stream to the polynomial. The selection module receives the fit values and coefficient values from the plural statistical filters and selects coefficient values from one of the filters in response to the fit values. The coefficient values are coupled to target motion analysis module which determines position and velocity of the target.

9 Claims, 1 Drawing Sheet

ENHANCED ADAPTIVE STATISTICAL FILTER PROVIDING IMPROVED PERFORMANCE FOR TARGET MOTION ANALYSIS NOISE DISCRIMINATION

STATEMENT OF GOVERNMENT INTEREST

The invention described herein may be manufactured by or for the Government of the United States of America for Governmental purposes without the payment of any royalties thereon or therefor.

BACKGROUND OF THE INVENTION

(1) Field of the Invention

The invention is generally related to the field of signal processing, primarily digital signal processing, and more particularly to the field of systems for performing target motion analysis. The invention provides an improved adaptive statistical filtering system for enhancing noise discrimination.

(2) Description of the Prior Art

Relative motion analysis is employed in a number of applications, including target motion analysis and robotics systems, to determine the range, bearing, speed, velocity and direction of motion (velocity) of an object relative to a sensor. In relative motion analysis, either or both of the object and the sensor may be stationary or in motion. Typical relative motion analysis systems include a sensor, a motion analysis processing arrangement and a filter. The sensor, typically a sonar or radar sensor, provides a data stream representing signals emanating from or reflected off the object, as received or observed by the sensor. The data stream includes not only the desired signal, representing information as to the object's position and motion relative to the sensor, but also undesirable random noise, such as that induced by the medium through which the signal travels. The filter is provided to reduce or eliminate the noise, effectively extracting from the data stream the portion representative of the object's position and motion relative to the sensor. The filter provides the extracted portion to the motion analysis processing arrangement, which uses the data stream to generate estimates of the position, and velocity of the object relative to the sensor.

Prior relative motion analysis systems that made use of single fixed-order filters did not provide optimum performance of extracting the desired portion of the data stream. On the other hand, a system including a plurality of filters of diverse orders, and an arrangement for determining the filter whose order provides an optimal performance is disclosed in U.S. Pat. No. 5,144,595, issued Sep. 1, 1992, to Marcus L. Graham, et al., entitled Adaptive Statistical Filter Providing Improved Performance For Target Motion Analysis Discrimination, assigned to the assignee of the present application, which patent is hereby incorporated by reference. The system described in the Graham patent provides better performance than prior systems that used only single fixed-order filters. However, the design of the system described in the Graham patent is based on the assumption that the noise component is completely random and that the noise component of the data stream at each point in time is completely uncorrelated to the noise component at successive points in time. This assumption is not necessarily correct. For many known sensors and data gathering techniques there is often a correlation between the portion of the noise component in the data stream at successive points in time.

Typically, for example, the data stream representation at a particular point in time as provided by typical sensors used with a relative motion analysis system is not just the instantaneous value of the signal as detected by the sensor at that point in time. Indeed, the value $D_n$ that is provided for a particular point in time $T_n$ is essentially taken over a window, termed the sample integration time, that the sensor requires to actually determine a value. In that technique, the sensor will receive a continuous stream of data dT, and, for each time $t_T$ for which it provides a value $D_T$, it will report the value as effectively the normalized sum of the value $d_T$ actually detected by the sensor at time $t_T$, and weighted values detected at selected previous points in time in the window defining the sample integration time. Otherwise stated, for each time $t_T$ $$D_T = A[d_T + \Sigma c_k d_{T-k}] \qquad \text{[Eqn. 1]}$$

where the sum is taken over "k" from "1" to "K". In equation Eqn. 1, each "Ck" represents a weighting coefficient, and "A" represents a normalization factor. Typically, the weighting coefficients $c_k$ will be positive, but will decrease toward zero as "k" increases, so that the contribution of components $d_{T-k}$ to the data value $D_T$ as provided by the sensor will decrease as their displacement from time $t_T$ increases. Otherwise stated, the values $d_{D-k}$ as detected by the sensor which are detected by the sensor closer to the time $t_T$ at which the sensor will provide a data value $D_T$ will provide a greater contribution to the value of $D_T$.

The particular function selected for the weighting coefficients ck will be selected based on a number of factors; in the typical case, the weighting coefficients may be, for example, an exponential function, in which case the coefficients will decrease exponentially. In any case, it will be apparent from equation Eqn. 1, since that $D_T$, the value of the data stream at each point in time as provided by the sensors, includes some components from values $d_{T-K}$ to $d_T$ as detected by the sensor, and since these values include a noise component as detected by the sensor at the respective points in time in the window, if, as is generally the case, there is an overlap in windows for successive points in time $t_T$, there will be a correlation between the noise component of values $D_T$ provided at successive points in time.

SUMMARY OF THE INVENTION

The invention provides a new and improved relative motion analysis system including an enhanced adaptive statistical filter for discriminating noise associated with measurement data, and which can be adapted to particular sensing techniques, to ensure that noise associated with the data measured at each point in time is not correlated with data measured at other points in time.

In brief summary, the relative motion analysis system includes an adaptive statistical filter system for receiving data streams comprising a series of data values from a sensor associated with successive points in time. Each data value includes a data component representative of the motion of a target and a noise component, with the noise components of data values associated with proximate points in time being correlated. The adaptive statistical filter system includes a prewhitener module, a plurality of statistical filters of different orders and a selection module. The prewhitener module receives the data stream from the sensor and generates a corrected data stream comprising a series of corrected data values each associated with a data value of the data stream, each including a data component and a noise component with the noise components of data values associated with proximate points in time being decorrelated. The plural statistical filters are coupled to receive the corrected data stream in parallel from the prewhitener. Each statistical filter generates coefficient values to fit the corrected data stream to a polynomial of corresponding order and fit values representative of the degree of fit of the corrected data stream to the polynomial. The selection module receives the fit values and coefficient values from the plural statistical filters and selects coefficient values from one of the filters in response to the fit values. The coefficient values are coupled to a target motion analysis module which determines position and velocity of the target.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF AN ILLUSTRATIVE EMBODIMENT

Figure 1:
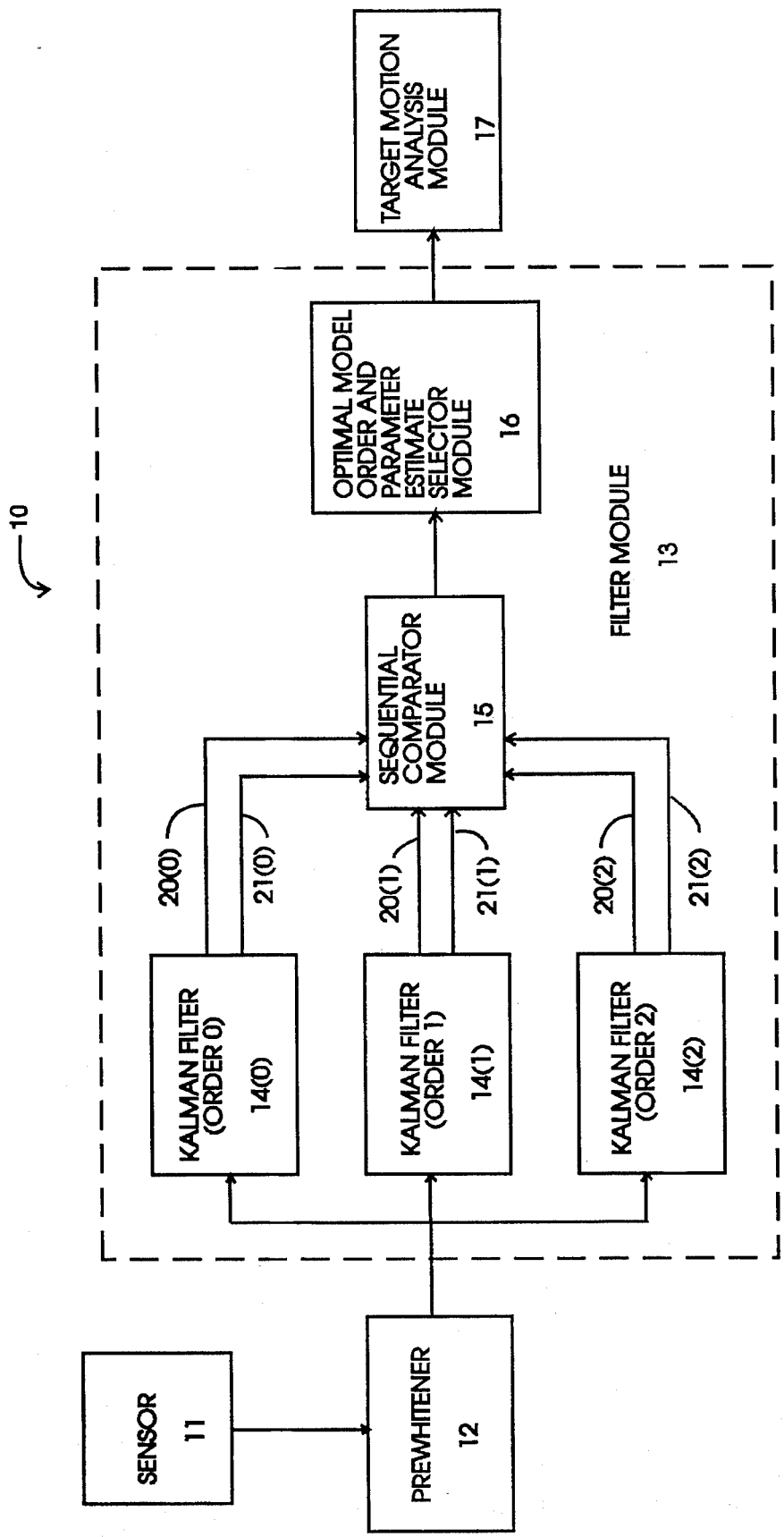
FIG. 1 is a functional block diagram of a relative motion analysis system as constructed in accordance with the invention.

FIG. 1 is a functional block diagram of a relative motion analysis system 10 as constructed in accordance with the invention. With reference to FIG. 1, system 10 includes a sensor 11, a prewhitener 12, a filter module 13 and a target motion analysis module 17. The sensor 11 generates, at successive points in time tm a measurement data stream $D_T$, which includes data regarding a target (not shown), plus noise introduced by the communication channel between the target and the sensor 11, and provides the data stream $D_T$ to the prewhitener 12. The measurement data stream provided by the sensor generally comprises data values representative of, for example, the angle of arrival of a sonar or radar signal detected by the sensor 11 at each point in time. Each data value provided by the sensor effectively reflects the value of the detected signal at a particular point of time as well as the values of the detected signal at proximate points of time over a predetermined time window which precedes time $t_T$, with the contribution provided by the values diminishing with increasing delay from the particular point in time with which the data value is associated. In one particular embodiment, the contribution to the data value $D_T$ generated by the sensor at each time $t_T$ provided by values of the detected signal from the sensor 11 prior to time $t_T$ decreases in accordance with an exponential weighting function, as described above in connection with equation Eqn. 1.

Since the data value $D_T$ provided by the sensor 11 associated with each point in time $t_T$ reflects the values of signals, including the desired signal and the noise, as detected at previous points in time, there is a degree of correlation of noise in the data values associated with proximate points in time. The prewhitener 12 receives the data values from the sensor 11, and generates corrected data values in which the noise is effectively de-correlated, effectively "whitening" the noise element in the corrected data stream that is provided to the filter module 13. The operation of the prewhitener 12 will be described below.

The filter module 13 receives the corrected data stream and processes it to generate values representing a fit of the corrected data stream to a curve defined by a polynomial of one of a selected series of orders, which are transmitted to the target motion analysis module 17. For details of the basic operational groundwork performed by filter module 13 and for details of target motion analysis module 17, see the aforementioned U.S. Pat. No. 5,144,595, issued Sep. 1, 1992, to Graham, et al. Generally, the filter module includes a plurality of Kalman filters 14(0) through 14(2) [generally identified by reference numeral 14(i)], where index "i" identifies the model order of the regression curve used in the respective filter 14(i). Thus, Kalman filter 14(0) uses a zeroth order Kalman filter, Kalman filter 14(1) uses a first order regression model, and Kalman filter 14(2) uses a second order regression model. Each Kalman filter 14(i), as is typical, receives an input data stream from the prewhitener 12 and generates an output comprised of data values that represent coefficients of a fit of the input data stream to a curve defined by a polynomial of the same order "i", using an adaptive least-squares fit technique. Thus, the Kalman filter 14(0) generates values reflecting a fit of the data stream input to it to a curve defined by a zeroth order polynomial, Kalman filter 14(1) generates values reflecting a fit of the data stream input to it to a curve defined by a first order polynomial, and Kalman filter 14(2) generates values reflecting a fit of the data stream input to it to a curve defined by a second order polynomial. In addition, each Kalman filter 14(i) generates an error value reflecting the difference between the curve defined by the values generated by it to the actual data values input to it, effectively constituting residual error values reflecting the goodness of the fit to the curve of the respective order "i." Each Kalman filter 14(i) provides the data values to a sequential comparator module 15 over a line 20(i), and the error values to the sequential comparator module 15 over a line 21(i).

The sequential comparator module 15 receives the data values and the error values over lines 20(i) and 21(i) from the respective Kalman filters 14(i) and performs a pair-wise F-test operation, which is described in detail in the aforementioned Graham, et al., patent, between error values of pairs of Kalman filters of adjacent orders, and in response selects the highest-ordered Kalman filter 14(i) for which the F-test operation provides a result above a predetermined threshold value. Thus, the sequential comparator module 15 performs the F-test operation using the error values from the highest-ordered Kalman filter 14(2) and the error values from the Kalman filter 14(1) of adjacent order (1), and in response generates an F-statistic value, which is also described in detail in the aforementioned Graham, et al., patent. If the F-statistic is above a predetermined threshold value, the sequential comparator module 15 selects the Kalman filter 14(2). However, if the F-statistic is not above the predetermined threshold value, the sequential comparator module 15 performs the F-test operation using error values from the Kalman filters 14(1) and 14(0), and generates a second F-statistic value. Again, if the F-statistic value is above a predetermined threshold value [which may be different from the threshold value used for the F-statistic value generated using error values from Kalman filters 14(2) and 14(1)], the sequential comparator module 15 selects the Kalman filter 14(1). On the other hand, if the F-statistic value generated using error values from the two low-order Kalman filters is not above the threshold value predetermined for that F-test operation, the sequential comparator module 15 selects the low-order Kalman filter 14(0).

The sequential comparator module 15 couples the data values from the Kalman filters 14(i) and the identification "i" of the selected Kalman filter to an optimum model order and parameter estimate selection module 16. In response, the module 16 couples the data values from the selected Kalman filter 14(i) to the target motion analysis module 17. The target motion analysis module 17 uses the data values to determine range and bearing of the target in a known manner.

It will be appreciated that the Kalman filters 14(i), sequential comparator module 15 and the optimum model order and parameter selection module 16 will perform the above-described operations iteratively, as successive values are received from the prewhitener 12 for successive points in time. Accordingly, the data values and error values provided by the Kalman filters 14(i) may be continuously updated at successive points in time, representing modification of the fits of the data input thereto to curves of the respective polynomial orders, as well as updating of the residual error values. In addition, the selection of Kalman filter 14(i) made by the sequential comparator module 15 may be continuously updated at successive points in time.

It will further be appreciated that the number of Kalman filters need not be limited to two. Thus, Kalman filters 14(i) of orders three and above may be provided in the filter module 13. If such higher-ordered Kalman filters 14(i) are provided, sequential comparator module 15 will perform a pair wise F-test operation between error values from adjacent-ordered filters as described above.

As noted above, the prewhitener 12 is provided to decorrelate the contribution of noise between data values $D_T$ it receives from the sensor 11 for proximate points in time. The prewhitener 12 uses an autoregression arrangement, in one embodiment a first order autoregression arrangement in which the correlation between noise components of a current and prior data measurement is $$E_T = p\, E_{T-1} + n \qquad \text{[Eqn. 2]}$$

where "$E_T$" and "$E_T$" represent the composite error term for the noise components of the data measurement for the current $t_T$ and previous $t_{T-1}$ times, as provided by the sensor 11 and "p" is a factor that represents the degree of correlation between the current and previous data measurement. The value of "n" represents the error term for the noise component of the current data measurement for the uncorrelated portion, and effectively represents the degree of contribution of signals in the portion of the time window that the sensor 11 uses in generating the data value $D_T$ associated with time $t_T$ that does not overlap with the time window that the sensor uses in generating the data value $D_{T-}$ associated with time $t_{T-}$. The prewhitener 12 subtracts the quantity "p" times the value $D_{T-}$ from the value $D_T$ to generate a value $D^*_T$ in the corrected data stream for that time "t" for which the noise component has been de-correlated from the noise components of values in the corrected data stream at adjacent time; that is, $$D^*_T = D_T - D_T - pD_{T-1}. \qquad \text{[Eqn. 3]}$$

It will be appreciated that the prewhitener 12 will not correct the first data value $D_0$ it receives from the sensor 11 associated with the initial time $t_0$, since there is no previous data value for which the noise component will be correlated.

While the prewhitener 12 in one embodiment is being described in terms of a first-order autoregression model, it will be appreciated that other models may be used for the prewhitener, including autoregression models of second and higher order and polynomial models.

The factor "p" in equations Eqn. 2 and Eqn. 3 will be determined by the particular mechanism used by the sensor 11 to correlate signal values received by it to generate data values that it provides to the prewhitener 12, which mechanism, it will be appreciated, will also result in correlation of the noise. Using the previously-described example of an exponentially weighted mechanism, the factor "p" will be determined from a knowledge of the effective integration time "s" (effectively the period of the time window) and the measurement sampling period "T" (that is, the time between successive measurements by the sensor 11), and is specifically given by $$p = e^{(-T/s)} \qquad \text{[Eqn. 4]}$$

were "e" is the mathematical constant (approximately 2.71828). It will be appreciated that the exponential function represented by equation Eqn. 4 is selected for the herein-described embodiment of prewhitener 12 since it reflects the exponential weighting function used by the sensor 11 in generating the successive data values $D_T$.

Using the factor "p" from equation Eqn. 4, the prewhitener 12 generates for each time $t_T$ the values of the data stream $D_T$ that it receives from the sensor 11 in accordance with equation Eqn. 3 to generate the corrected values $D^*_T$ for the corrected data stream, for each time $t_T$ after time $t_0$.

While the prewhitener 12 has been described as using a first-order autoregression model to transfor to corrected values $D_T$, it will be appreciated by those skilled in the art that other models may be used, including second- and higher-order autoregression models and polynomial models. In addition, it will be appreciated that the particular exponential form of factor "p" defined in equation Eqn. 4 is defined in accordance with the particular model implemented by the sensor 11 to generate data values. Accordingly, factor "p" for a prewhitener 12 used in a system in which the sensor implements a different model may be determined in accordance with the particular model implemented by the sensor.

The invention provides a number of advantages. In particular, the relative motion analysis system 10 constructed in accordance with the invention will provide for improved accuracy and an enhanced noise filtration without significant loss of information in the presence of correlated noise.

What is claimed is:

1. An adaptive statistical filter system for receiving data streams comprising a series of data values from a sensor associated with successive points in time, the sensor using a selected data value generation mechanism to generate the data values, each said data value including a data component representative of the motion of a target and a noise component, with the noise components of data values associated with proximate points in time being correlated reflecting the selected data value generation mechanism used by the sensor in generating the data values, the system including:

a prewhitener for receiving the data stream from the sensor and generating a corrected data stream, the corrected data stream comprising a series of corrected data values each associated with a data value of the data stream, each including a data component and a noise component, the prewhitener using a selected decorrelation mechanism to generate the corrected data, the decorrelation mechanism being selected in response to the selected data value generation mechanism used by the sensor such that the noise components of corrected data values associated with proximate points in time are decorrelated;

plural statistical filters of different orders coupled to receive said corrected data stream in parallel from said prewhitener, each statistical filter generating coefficient values to fit the corrected data stream to a polynomial of corresponding order and fit values representative of the degree of fit of corrected data stream to the polynomial; and selection means for receiving the fit values and coefficient values from the plural statistical filters and selecting one of said filters in response to the fit values, the coefficient values of the selected filter being used by a target motion analysis module to determine the position and velocity of the target.

2. An adaptive statistical filter system as defined in claim 1 in which each said statistical filter comprises a Kalman filter.

3. An adaptive statistical filter system as defined in claim 1 in which said selection means performs a pair-wise F-test operation in connection with said fit values provided by said statistical filters of adjacent order, selects one of said filters in response to the F-test operation.

4. An adaptive statistical filter system as defined in claim 3 in which said selection means selects the highest-ordered one of said statistical filters for which the pair-wise F-test operation provides an F-statistic above a predetermined threshold value.

5. An adaptive statistical filter system as defined in claim 1 in which said sensor generates each data value over a selected time window, with time windows for proximate data values overlapping, in which case the noise components of the proximate data values will be correlated, the prewhitener generating a correction factor that reflects the degree of correlation of the noise component and using the correction factor to generate the corrected data values for the corrected data stream.

6. An adaptive statistical filter system as defined in claim 5 in which the prewhitener generates the correction factor for each data value using the correction factor for the previous data value.

7. An adaptive statistical filter system as defined in claim 6 in which the prewhitener generates the correction factor as a first-order autoregression arrangement in which the correlation between noise components of a data value and a prior data value is $E_T = p\ E_{T-1} + n$ where "$E_T$" and "$E_{T-1}$" represent the composite error term for the noise components of the data measurement for the current data value and previous data value as provided by the sensor, "p" is a factor that represents the degree of correlation between the current and previous data measurement, and "n" represents the error term for the noise in the portion of the time windows that do not overlap.

8. An adaptive statistical filter system as defined in claim 7 in which the sensor generates each data value using a selected integration arrangement for integrating values of signals received over said time window, and the factor "p" is selected in response to the selected integration arrangement.

9. An adaptive statistical filter system as defined in claim 8 in which the selected integration arrangement is an exponential arrangement, in which each data value generated by the sensor associated with a selected time is generated in response to values of signals received over the time window prior to the selected time, with the contribution of signal values to the data value diminishing in a selected exponential relationship to the distance from the selected time, the prewhitener using as factor "p" a value corresponding to $p = e^{(-T/s)}$, where "s" is the period of the time window, "T" is the time between the end of successive time windows and "e" is the mathematical constant (approximately 2.71828).

* * * * *